(12) United States Patent
Wheeler et al.

(10) Patent No.: US 6,721,925 B2
(45) Date of Patent: Apr. 13, 2004

(54) EMPLOYING INTELLIGENT LOGICAL MODELS TO ENABLE CONCISE LOGIC REPRESENTATIONS FOR CLARITY OF DESIGN DESCRIPTION AND FOR RAPID DESIGN CAPTURE

(75) Inventors: William R. Wheeler, Southborough, MA (US); Timothy J. Fennell, Holliston, MA (US); Matthew J. Adiletta, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 10/025,193

(22) Filed: Dec. 18, 2001

(65) Prior Publication Data

US 2003/0046642 A1 Mar. 6, 2003

Related U.S. Application Data

(60) Provisional application No. 60/315,852, filed on Aug. 29, 2001.

(51) Int. Cl.[7] .............................................. G06F 17/50
(52) U.S. Cl. ........................ 716/2; 716/18; 716/7; 716/3
(58) Field of Search ............... 716/18, 7, 3, 2

(56) References Cited

U.S. PATENT DOCUMENTS

| 4,703,435 A | * 10/1987 | Darringer et al. ............ 716/18 |
| 4,970,664 A | * 11/1990 | Kaiser et al. ................ 345/804 |
| 5,128,871 A | 7/1992 | Schmitz ....................... 716/17 |

(List continued on next page.)

FOREIGN PATENT DOCUMENTS

| EP | 720233 A2 | * 7/1996 | ........... H01L/27/02 |
| JP | 58060559 A | * 4/1983 | ........... H01L/21/82 |
| JP | 03225523 A | * 10/1991 | ............. G06F/9/06 |
| JP | 07049890 A | * 2/1995 | ........... G06F/17/50 |
| JP | 08314892 A | * 11/1996 | ........... G06F/17/00 |
| JP | 2001068994 A | * 3/2001 | ......... H03K/19/177 |

OTHER PUBLICATIONS

NN7807629, "Functional Oriented Symbolic Macromodeling Algorithm", IBM Technical Disclosure Bulletin, vol. 21, No. 2, Jul. 1978, pp. 629–631 (5 pages).*
NN9407481, "Functional Modeling using Object Collaboration Diagram", IBM Technical Disclosure Bulletin, vol. 37, No. 7, Jul. 1994, pp. 481–486 (6 pages).*
NB84035598, "Binary Relational Schema to Model Structured LSI Design", IBM Technical Disclosure Bulletin, vol. 26, No. 10B Mar. 1984, pp. 5598–5601 (5 pages).*
NN8006341, "Macro Physical–To–Logical Checking LSI Chip Design", IBM Technical Disclosure Bulletin, vol. 23, No. 1, Jun. 1980, pp. 341–345 (7 pages).*
Kutzschebauch, "Efficient logic optimization using regularity extraction", Proceedings of 2000 International Conference on Computer Design, Sep. 17, 2000, pp. 487–493.*
Foley et al., "An Object Based Graphical User Interface for Power Systems", IEEE Transactions on Power Systems, vol. 8, No. 1, Feb. 1993, pp. 97–104.

(List continued on next page.)

Primary Examiner—Matthew Smith
Assistant Examiner—Phallaka Kik
(74) Attorney, Agent, or Firm—Fish & Richardson P.C.

(57) ABSTRACT

Representing a logic device generally includes creating a model of a logic device, where the model represents a collection of variants of the logic device. A representation of the model may be used in a logic design and a particular variant of the logic device may be selected automatically based on connections made to the representation. Connection errors may be detected automatically and a first indication may be displayed automatically when the connection errors are detected. A second indication that differs from the first indication may be displayed automatically when the connection errors are corrected.

35 Claims, 6 Drawing Sheets

U.S. PATENT DOCUMENTS

| | | | | |
|---|---|---|---|---|
| 5,212,650 A | * | 5/1993 | Hooper et al. | 716/18 |
| 5,220,512 A | | 6/1993 | Watkins et al. | 716/11 |
| 5,258,919 A | | 11/1993 | Yamanouchi et al. | 716/11 |
| 5,267,175 A | * | 11/1993 | Hooper | 716/18 |
| 5,287,289 A | * | 2/1994 | Kageyama et al. | 716/18 |
| 5,297,053 A | * | 3/1994 | Pease et al. | 700/182 |
| 5,475,605 A | * | 12/1995 | Lin | 716/6 |
| 5,493,507 A | * | 2/1996 | Shinde et al. | 703/14 |
| 5,506,788 A | | 4/1996 | Cheng et al. | 716/10 |
| 5,513,119 A | | 4/1996 | Moore et al. | 716/8 |
| 5,553,002 A | | 9/1996 | Dangelo et al. | 716/11 |
| 5,568,397 A | * | 10/1996 | Yamashita et al. | 716/11 |
| 5,598,347 A | * | 1/1997 | Iwasaki | 716/8 |
| 5,629,857 A | | 5/1997 | Brennan | 716/11 |
| 5,663,662 A | * | 9/1997 | Kurosawa | 326/41 |
| 5,666,289 A | | 9/1997 | Watkins | 716/8 |
| 5,685,006 A | * | 11/1997 | Shiraishi | 712/34 |
| 5,724,250 A | * | 3/1998 | Kerzman et al. | 716/3 |
| 5,828,581 A | | 10/1998 | Matumura | 716/12 |
| 5,841,663 A | * | 11/1998 | Sharma et al. | 716/18 |
| 5,852,564 A | | 12/1998 | King et al. | 703/14 |
| 5,889,677 A | | 3/1999 | Yasuda et al. | 716/6 |
| 5,892,678 A | | 4/1999 | Tokunoh et al. | 716/2 |
| 5,892,682 A | * | 4/1999 | Hasley et al. | 716/12 |
| 5,933,356 A | | 8/1999 | Rostoker et al. | 703/15 |
| 5,963,724 A | | 10/1999 | Mantooth et al. | 703/14 |
| 6,044,211 A | * | 3/2000 | Jain | 716/18 |
| 6,053,947 A | | 4/2000 | Parson | 703/14 |
| 6,066,179 A | | 5/2000 | Allan | 716/4 |
| 6,106,568 A | | 8/2000 | Beausang et al. | 716/18 |
| 6,117,183 A | | 9/2000 | Teranishi et al. | 716/11 |
| 6,120,549 A | | 9/2000 | Goslin et al. | 703/20 |
| 6,132,109 A | | 10/2000 | Gregory et al. | 717/131 |
| 6,135,647 A | | 10/2000 | Balakrishnan et al. | 716/18 |
| 6,152,612 A | | 11/2000 | Liao et al. | 703/23 |
| 6,205,573 B1 | | 3/2001 | Hasegawa | 716/11 |
| 6,216,256 B1 | * | 4/2001 | Inoue et al. | 716/6 |
| 6,219,822 B1 | | 4/2001 | Gristede et al. | 716/10 |
| 6,233,540 B1 | | 5/2001 | Schaumont et al. | 703/14 |
| 6,233,723 B1 | | 5/2001 | Pribetich | 716/17 |
| 6,236,956 B1 | | 5/2001 | Mantooth et al. | 703/14 |
| 6,260,179 B1 | | 7/2001 | Ohsawa et al. | 716/5 |
| 6,272,671 B1 | | 8/2001 | Fakhry | 716/18 |
| 6,275,973 B1 | * | 8/2001 | Wein | 716/10 |
| 6,292,931 B1 | * | 9/2001 | Dupenloup | 716/18 |
| 6,298,468 B1 | | 10/2001 | Zhen | 716/2 |
| 6,311,309 B1 | | 10/2001 | Southgate | 716/1 |
| 6,324,678 B1 | | 11/2001 | Dangelo et al. | 716/18 |
| 6,327,693 B1 | * | 12/2001 | Cheng et al. | 716/2 |
| 6,353,806 B1 | * | 3/2002 | Gehlot | 703/21 |
| 6,353,915 B1 | * | 3/2002 | Deal et al. | 716/4 |
| 6,366,874 B1 | | 4/2002 | Lee et al. | 703/14 |
| 6,378,115 B1 | | 4/2002 | Sakurai | 716/7 |
| 6,381,565 B1 | * | 4/2002 | Nakamura | 703/28 |
| 6,401,230 B1 | * | 6/2002 | Ahanessians et al. | 716/1 |
| 6,421,816 B1 | * | 7/2002 | Ishikura | 716/7 |
| 6,438,731 B1 | * | 8/2002 | Segal | 716/2 |
| 6,440,780 B1 | * | 8/2002 | Kimura et al. | 438/129 |
| 6,449,762 B1 | | 9/2002 | McElvain | 716/18 |
| 6,457,164 B1 | | 9/2002 | Hwang et al. | 716/8 |
| 6,473,885 B1 | * | 10/2002 | Wallace | 716/4 |
| 6,477,683 B1 | | 11/2002 | Killian et al. | 716/1 |
| 6,477,688 B1 | * | 11/2002 | Wallace | 716/18 |
| 6,477,689 B1 | | 11/2002 | Mandell et al. | 716/11 |
| 6,480,985 B1 | | 11/2002 | Reynolds et al. | 716/1 |
| 6,487,698 B1 | | 11/2002 | Andreev et al. | 716/3 |
| 6,505,341 B1 | | 1/2003 | Harris et al. | 717/100 |
| 6,519,755 B1 | | 2/2003 | Anderson | 716/18 |
| 6,523,156 B2 | * | 2/2003 | Cirit | 716/9 |
| 6,539,536 B1 | * | 3/2003 | Singh et al. | 716/18 |
| RE38,059 E | * | 4/2003 | Yano et al. | 716/1 |
| 6,546,528 B1 | * | 4/2003 | Sasaki et al. | 716/5 |
| 6,574,787 B1 | * | 6/2003 | Anderson | 716/18 |
| 6,591,407 B1 | * | 7/2003 | Kaufman et al. | 716/10 |
| 2001/0018758 A1 | | 8/2001 | Tanaka et al. | 716/6 |
| 2002/0023256 A1 | | 2/2002 | Seawright | 716/18 |
| 2002/0042904 A1 | | 4/2002 | Ito et al. | 716/8 |
| 2002/0046386 A1 | | 4/2002 | Skoll et al. | 716/1 |
| 2002/0049957 A1 | | 4/2002 | Hosono et al. | 716/5 |
| 2002/0112221 A1 | * | 8/2002 | Ferreri et al. | 716/17 |
| 2002/0166100 A1 | | 11/2002 | Meding | 716/5 |
| 2003/0005396 A1 | | 1/2003 | Chen et al. | 716/3 |
| 2003/0016206 A1 | | 1/2003 | Taitel | 345/103 |
| 2003/0016246 A1 | | 1/2003 | Singh | 716/18 |
| 2003/0177455 A1 | * | 9/2003 | Kaufman et al. | 716/2 |

OTHER PUBLICATIONS

Pedram et al., "Floorplanning with Pin assignment", 1990 IEEE International Conference on Computer–Aided Design, Nov. 11, 1990, pp. 98–101.

Mentor Graphics Corporation, Renoir™ With HDL2Graphics™, pp. 1–6, 1998, Oregon.

Mentor Graphics Corporation, Renoir HDL Design Datasheet, pp. 1–2, 1999, Oregon.

Computer Design, "After Hard Knocks, Cycle–Based Simulators Stand Their Ground". http://www.computer-design.com/Editorial/1996/10/ASIC/after.html, accessed on Aug. 23, 2001, pp. 1–5.

Mentor Graphics Corporation, Renoir™ With HDL2Graphics™, 1998, Oregon, 6 pages.

Mentor Graphics Corporation, Renoir HDL Design Datasheet, 1999, Oregon, 2 pages.

* cited by examiner

EMPLOYING INTELLIGENT LOGICAL MODELS TO ENABLE CONCISE LOGIC REPRESENTATIONS FOR CLARITY OF DESIGN DESCRIPTION AND FOR RAPID DESIGN CAPTURE

CROSS-REFERENCE TO RELATED APPLICATIONS

This application claims priority from U.S. Provisional Application No. 60/315,852, filed Aug. 29, 2001, and titled "Visual Modeling and Design Capture Environment," which is incorporated by reference.

TECHNICAL FIELD

This invention relates to employing intelligent logical models to enable concise logic representations for clarity of design description and for rapid design capture.

BACKGROUND

Logic designs for computer chips typically include combinatorial elements and state elements. Combinatorial elements, such as AND gates and OR gates, combine two or more logic states to produce an output. State elements, such as latches and flip-flops (FFs), hold a logic state for a period of time, usually until receipt of an external clock signal. The combinatorial and state elements may be represented in a logic design using a conventional schematic or 2-dimensional design. Conventional schematic designs, however, do not provide the flexibility desired by many logic designers.

DESCRIPTION OF DRAWINGS

Like reference symbols in the various drawings indicate like elements.

DETAILED DESCRIPTION

Figure 1:
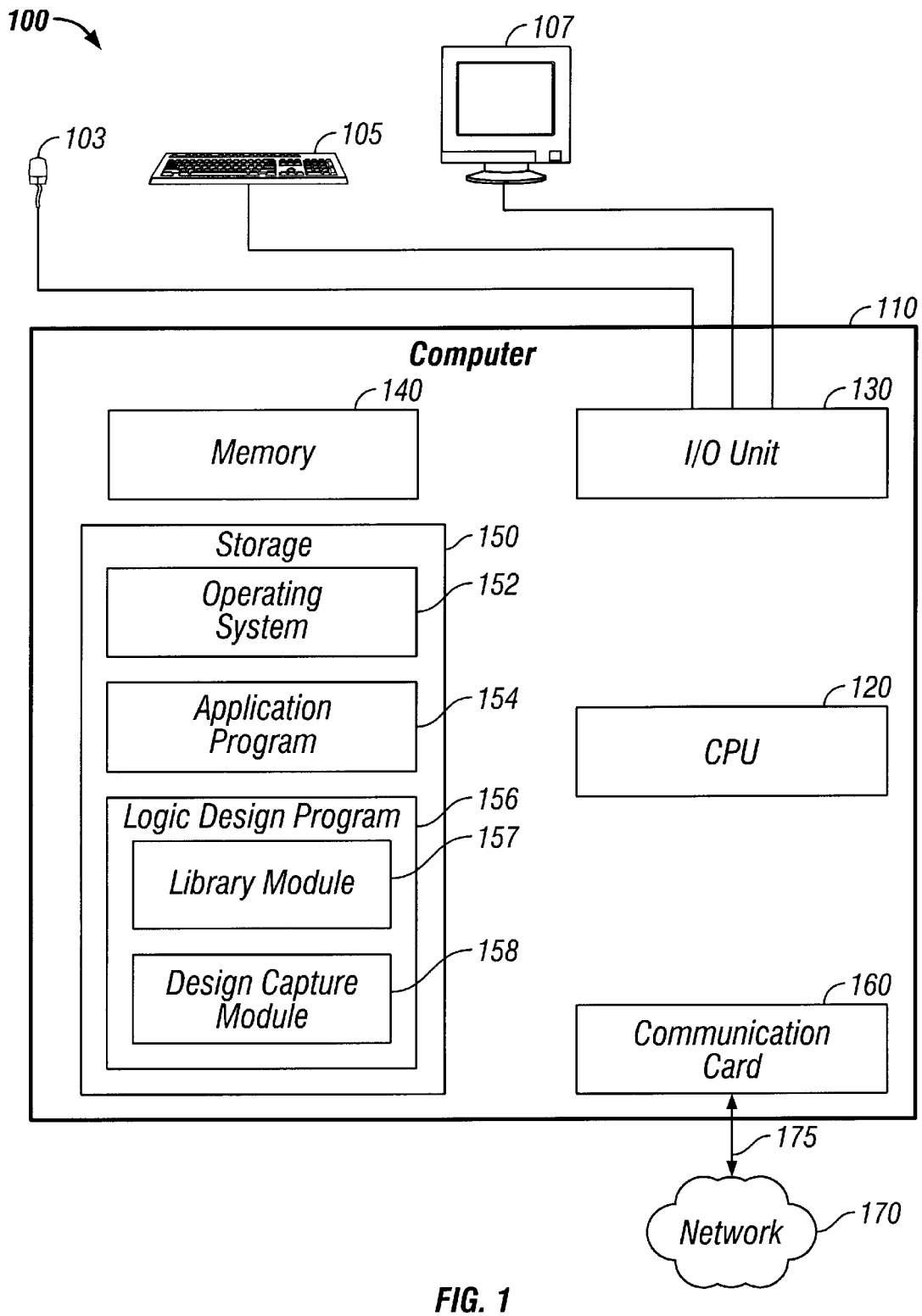
FIG. 1 is a block diagram of a computer system.

FIG. 1 illustrates an exemplary system 100 such as a computer system that may be used in the logic design process. The system 100 may include various input/output (I/O) devices (e.g., mouse 103, keyboard 105, and display 107) and a general purpose computer 110 having central processor unit (CPU) 120, I/O unit 130, memory 140, and storage 150. Storage 150 may store machine-executable instructions, data, and various programs such as an operating system 152, one or more application programs 154, and one or more logic design programs 156, all of which may be processed by CPU 120.

System 100 also may include a communications card or device 160 (e.g., a modem and/or a network adapter) for exchanging data with a network 170 using a communications link 175 (e.g., a telephone line, a wireless network link, a wired network link, or a cable network). Other examples of system 100 may include a handheld device, a workstation, a server, a device, a component, other equipment, or some combination of these capable of responding to and executing instructions in a defined manner.

System 100 may be arranged to operate in concert with one or more similar systems to facilitate the logic design process. The logic design process may include different tasks, such as, for example, design, capture, documentation, compilation, simulation, and debug. The system 100 includes a logic design program 156 stored in storage 150 and used during the logic design process. The logic design program 156 includes a library module 157 that stores models of logic devices that are used to create logic designs. Models of logic devices may include, for example, state elements (e.g., flip-flops and latches), combinatorial elements (e.g., AND gates, NAND gates, OR gates, binary operator gates, and multiplexers), tri-state devices and drivers, data buses (e.g., tri-state buses), memory components (e.g., first-in/first-out (FIFO) memory), clocks, and other elements commonly found in a logic design.

A single model of a logic device may represent a collection of variants of the logic device. For instance, a single model of a register gate may represent the variants of a flip-flop. The model of the register gate may be changed into any variants of a flip-flop, such as, for example, resetable, settable, enableable, rising edge, falling edge, input inverting, and output inverting flip-flops. By using a single model to represent the variants of a logic device, the number of models required in the library module 157 is reduced. This may allow for more efficient management and simplification of the number of models of logic devices used in the library module 157.

The logic design program 156 also includes a design capture module 158 that uses a representation of a model of a logic device from the library module 157 in a logic design. A particular variant of the logic device may be selected automatically based on connections made to the representation. Connections made to the representation may include proximity wiring, which includes dragging a representation of a wire near the representation of the logic device. The logic model automatically selects the particular type of connection and/or variant of the logic device based on the location of the proximity wiring in relation to the representation of the logic model. For example, if the proximity wiring is performed on the input side of the representation, then an input to the logic device is created. The proximity wiring of an input to the logic device may create other connections that are needed as a result of creating the input for that particular logic device.

Additionally or alternatively, the particular variant of the logic device may be selected based on an action that cycles through various pin properties. For instance, selecting a particular pin property of the representation may include toggling the pin property among various pin properties and/or selecting a particular pin property may result in production of a menu from which the various pin properties may be selected.

The model of the logic device may automatically detect connection errors without requiring any additional action (e.g., an action from a user). The automatic detection of connection errors may occur when a representation of the logic device is inserted in a logic design and/or when one or more connections to the representation of the logic device are modified. Connections to the representation of the logic device may be modified by adding new connections, removing connections, and/or changing properties of existing connections. An indication may be automatically displayed to indicate that one or more connection errors exist. When the connection errors are corrected, a different indication may be automatically displayed to indicate that the connection errors have been corrected. For example, devices for which connection errors exist may be displayed using a first color while devices for which connection errors do not exist are displayed using a second color.

Figure 2:
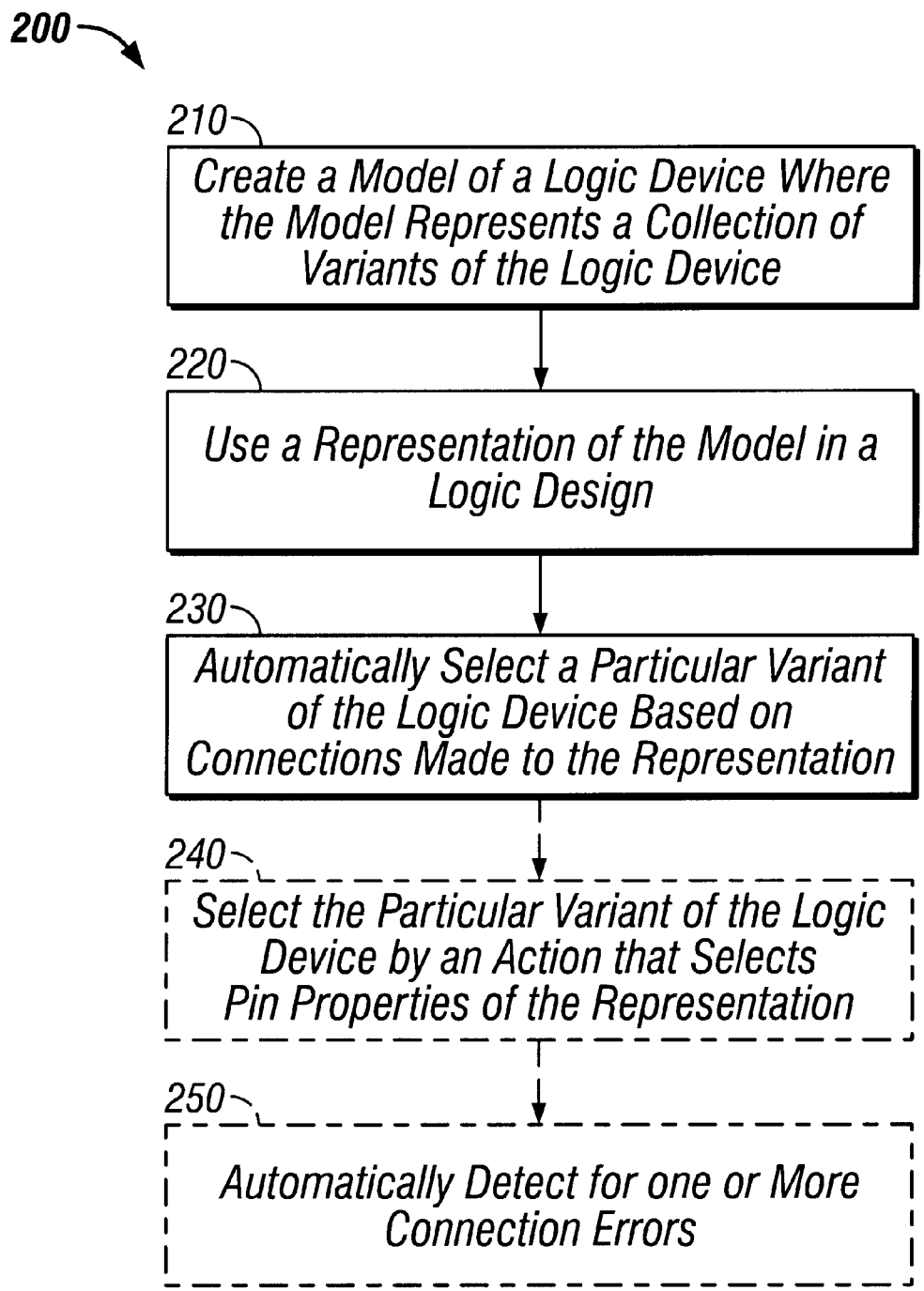
FIG. 2 is a flow chart of a process of representing a logic device.

FIG. 2 illustrates an exemplary process 200 for representing a logic device. Process 200 typically includes creating a model of a logic device (210). The model of the logic device represents a collection of variants of the logic device. A representation of the model is used in a logic design (220) and a particular variant of the logic device is automatically selected based on connections made to the representation (230). For instance, the particular variant of the logic device may be automatically selected based on connecting a representation of a wire to the representation of the logic model (230). As connections are modified, the particular variant of the logic device may be automatically changed.

Process 200 further includes selecting the particular variant of the logic device by an action that selects pin properties of the representation (240). For instance, the action that selects the pin properties may include clicking on a portion of the representation and selecting a particular pin property from a menu that is presented (240).

Process 200 also includes automatically detecting one or more connection errors (250). For instance, a connection error may include a bit-width discrepancy between one or more inputs and one or more outputs of the representation of the logic model (250). A connection error also may include an unconnected pin that requires a connection. An indication (e.g., visual, audio, or otherwise) may be displayed to indicate that a connection error exists. For example, the representation of the logic model may use colors to indicate the presence of a connection error (e.g., red to indicate a connection error). If the connection error is corrected, then the representation of the logic model may change indications (e.g., by changing from one color to another color) to indicate that the error has been corrected.

If multiple connection errors are indicated, then the representation of the logic model may change indications once all of the connections errors have been corrected. Additionally or alternatively, if multiple connection errors are indicated, then the representation of the logic model may change indications to indicate that one or more of the correction errors have been corrected, but that at least one correction error still exists.

Process 200 may further include generating a C++ model and/or a Verilog model of the logic design. The representation of a logic model used in the logic design may be represented as a C++ model and/or a Verilog model.

Illustrated below are exemplary implementations of various models of logic devices capable of being used as part of the library module 157 and the design capture module 158 of FIG. 1 and in process 200 of FIG. 2, as described above.

Figure 3A:
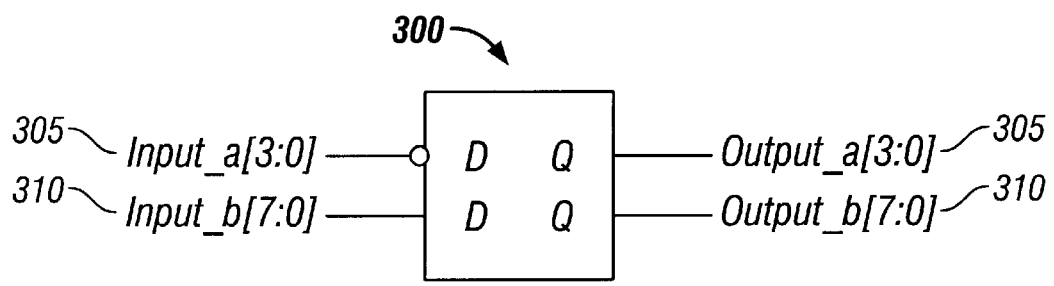
FIG. 3A is a block diagram of a model of a register.

FIG. 3A illustrates an exemplary block diagram of a model of a register gate 300. In this example, the register gate 300 includes a first D/Q input/output pair 305 and a second D/Q input/output pair 310. The register gate 300 may represent a flip-flop (e.g., an edge-triggered state element) or a latch (e.g., a level-sensitive state element), and all of the variants of flip-flops and latches. The variants of the register gate 300 may be automatically selected based on connections made to the register gate 300. Additionally or alternatively, variants of the register gate 300 may be selected by an action applied to the pin properties of the representation.

When the register gate represents a flip-flop, the variants may include a resetable, settable, enableable, rising edge, falling edge, input inverting, and output inverting flip-flop. The single model of the register gate 300 may be changed into any of these variants automatically based on connections made to the representation of the logic model or by an action such as mouse clicking on the representation and/or on the appropriate pin on the representation and cycling through a menu of the variants. A default representation of the register gate 300 may include a predetermined number of pairs of D/Q input/output pins.

Each D/Q input/output pair 305, 310 may have an independent bit width. Additional inputs and outputs may be added to the register gate and the register gate automatically checks for and detects connection errors, such as, for example, comparing the input bit width against the output bit width and detecting whether the number of inputs match the number of outputs. An input/output pair may be automatically created when a wire connection is made to either the input or the output side of the register gate. The register gate may be sized (e.g., by stretching from a default size) to accommodate more input/output pairs. For instance, if a new input is added, the model of the register gate may add a corresponding output or may indicate that a corresponding output is needed.

Figure 3B:
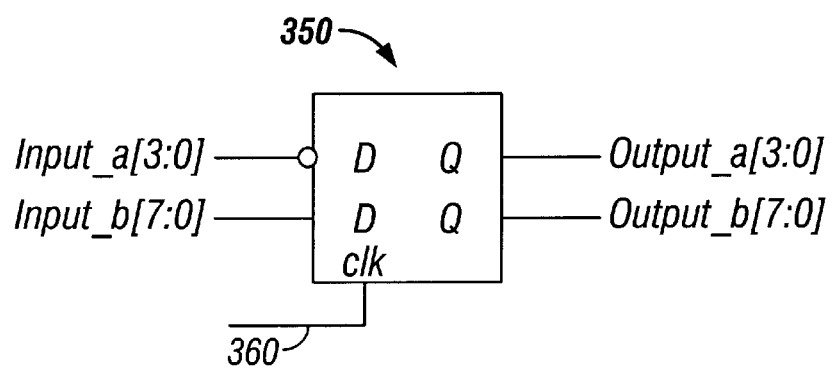
FIG. 3B is a block diagram of a model of a register including a clock input.

In the case of register gate 300, the inputs and outputs may be inverted. The register gate 300 may use a default clock associated with the logic design or associated with a particular portion of the logic design. A clock that differs from the default clock may be added to the register gate by proximity wiring to the clock input on the representation of the register gate. FIG. 3B illustrates a register gate 350 using a non-default clock 360. In one implementation, a register gate to which a clock input is not explicitly connected may be implicitly connected as a positive edge flip-flop to the net associated with the default clock input port.

Various pin properties of the register gate may be selected and changed. For example, the assertion/edge value may be modified by mouse clicking on the clock pin and cycling thru a menu of assertion choices without having to delete the representation of the register model, go back to the library module, and find the model of the register gate that includes all of the specific properties that are required for a particular logic design. When the register gate represents a flip-flop, the flip-flop may be enabled by proximity wiring to the enable portion of the flip-flop. An indication of the enable may be displayed on the representation. Additionally, the assertion level for the enable may be changed by selecting the enable and selecting the desired assertion level from a menu of assertion level choices.

More specifically, for example, proximity wiring to the central three positions on either of the sides perpendicular to the data input and output sides may create a control input. The clock control pin property may be edited using pin implementation properties to select the pin as either edge or level sensitive to create a flip-flop or latch respectively. An indication may be displayed to distinguish graphically between a flip-flop and a latch. In one implementation, for instance, an flip-flop may be designated by displaying a "V" near the clock pin to indicate an edge-triggered device.

Figure 4:
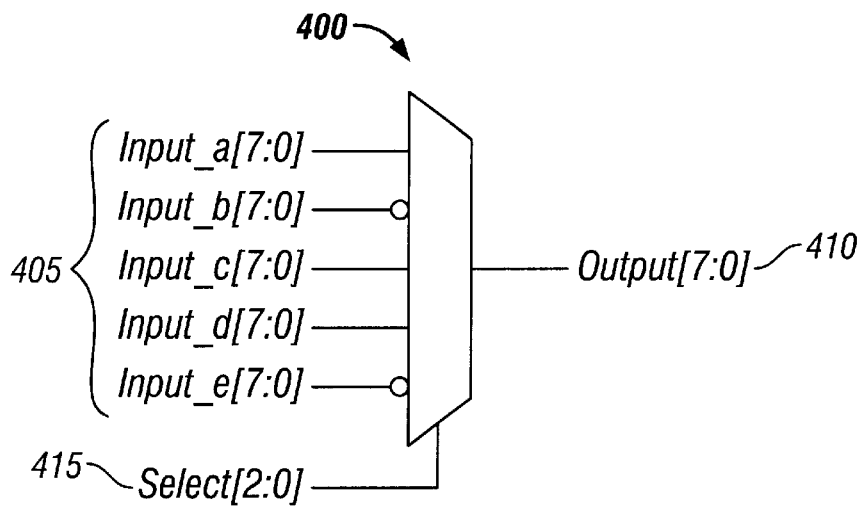
FIG. 4 is a block diagram of a model of a multiplexer.

FIG. 4 illustrates a block diagram of an exemplary model of a multiplexer 400. In this example, the multiplexer 400 includes a set of inputs 405, an output 410, and select inputs 415. Any input 405 may be inverted by toggling the polarity of the input pin. In this example, Input_b 405 and Input_e 405 each include a bubble to indicate that the inputs are inverted. In one implementation, the model of the multiplexer 400 may be used to represent a collection of variants of multiplexer devices. For instance, the model of the multiplexer may represent a multiplexer or a priority gate encode. The model of the multiplexer 400 may be stretched to accommodate additional connections. Additional inputs may be made to the multiplexer by proximity wiring to the data input side 405 of the multiplexer.

The pin property of each input 405 may be used to specify the select condition for the corresponding data input. The select condition may be specified as a Verilog constant.

The model of the multiplexer automatically checks for connection errors. For example, the model automatically checks to ensure that the data inputs and the data output have the same bit width. The multiplexer model also automatically checks for connection errors between the width of the select input 415 and the number of data inputs 405. The multiplexer model also automatically checks for errors when more than one input has the same select value associated with it.

The multiplexer model may be selected to enable or disable different select directives. In one implementation, for instance, a "full case" synthesis directive may be enabled, in which case a logic designer is not required to designate a data input for each select input. Any non-designated select inputs may be treated as defaults or "don't cares." Thus, in the case of a three-bit select input, it is not necessary to have all eight inputs. If the full case synthesis directive is not enabled, then the logic designer must specify the terms that cover the entire Boolean space specified by the width of the select input. In the case of a three-bit select input, then it would be necessary to specify terms that cover eight inputs.

Additionally or alternatively, for example, a "parallel case" synthesis directive may be enabled, in which case no overlap may occur in select inputs.

Figure 5:
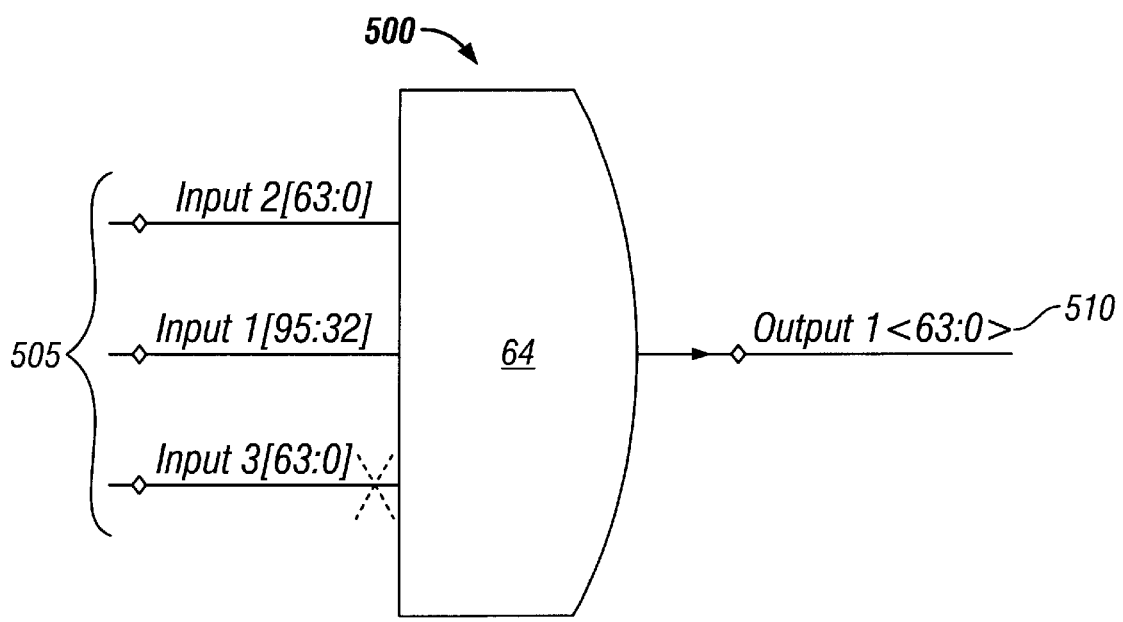
FIG. 5 is a block diagram of a model of an AND gate.

FIG. 5 illustrates a block diagram of an exemplary AND gate 500. In this example, the AND gate 500 includes a set of inputs 505 and an output 510. Variants of the AND gate 500 may be automatically selected based on connections to the AND gate. For instance, additional inputs may be added by proximity wiring to the input side 505 of the AND gate. Any input pin or output pin may be inverted by toggling the polarity of the pin. The logic model of the AND gate 500 automatically checks for connection errors. For instance, a connection error may occur when an input bit width does not match the output bit width. An indication may be displayed to indicate that a connection error exists. When a connection error is resolved, the indication may change to indicate that the connection error has been corrected.

Figure 6:
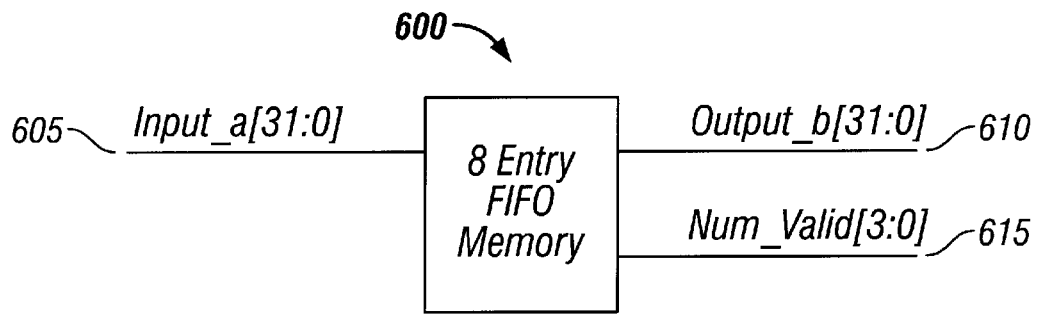
FIG. 6 is a block diagram of a model of a FIFO memory.

FIG. 6 illustrates a block diagram of an exemplary model of a FIFO memory 600. In this example, the FIFO memory 600 includes an input 605, an output 610, and a set of pins representing a number of valid entries 615. As with the other logic models described, additional inputs and outputs may be added to the FIFO memory 600 by proximity wiring. The model of the FIFO memory 600 also automatically detects connection errors and displays an indication that a connection error exists. In the case of a FIFO memory, a connection error may indicate when the input bit width 605 does not match the output bit width 610.

In this example, the logic model of the FIFO memory 600 also includes a set of pins for the number of valid entries 615. The FIFO memory model automatically adjusts the bit width of this pin based on the size of the FIFO memory. In this implementation, the FIFO memory 600 is an eight-entry FIFO meaning that the number of valid pins needs to have a bit width of four bits to represent the eight entries. If the number of FIFO entries is modified, then the logic model of the FIFO memory automatically determines if the bit width of the number of valid entries pin needs to be changed and automatically changes the bit width if necessary.

Figure 7:
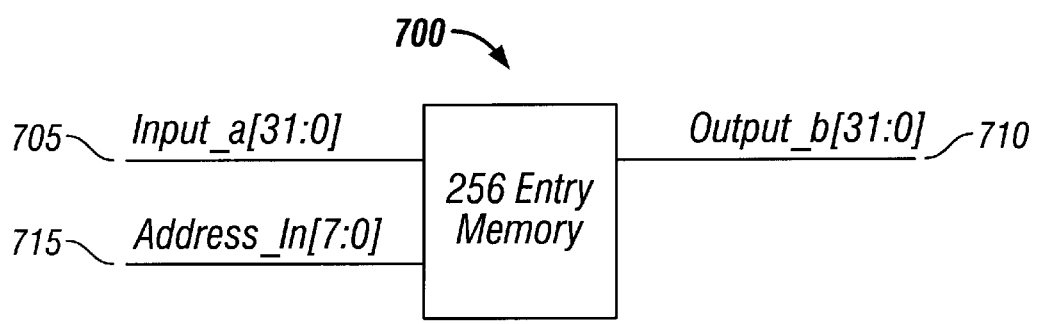
FIG. 7 is a block diagram of a model of a memory gate.

FIG. 7 illustrates a block diagram of an exemplary model of a memory gate 700. In this example, the memory gate 700 represents a 256-entry memory that includes a 32-bit data input 705, a 32-bit data output 710, and an eight-bit address line 715. The model of the memory gate 700 automatically sets the address to correspond to the number of entries for the memory. In this case, a 256-entry memory requires an eight-bit address line 715, so the memory gate model automatically selects an eight-bit address line.

Numerous variants of a memory gate are possible. For example, read and write ports for a memory gate may be dynamically configurable. The read ports and the write ports may be included with or without enables. The model of the memory gate automatically determines the appropriate pins to display on the representation of the memory gate based on the port configuration.

Binary operator gates typically have different pin widths depending on the binary operator type. The logic model of a binary operator gate automatically sizes the output based on the binary operation being performed by the gate. The logic model of the binary operator gate automatically checks for connection errors, such as, for example, bit width errors between inputs and outputs.

Figure 8A:
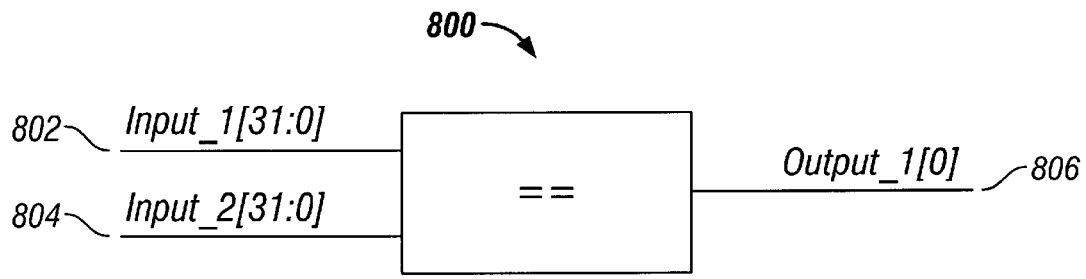
FIG. 8a is a block diagram of a model of a binary operator gate.

FIG. 8a illustrates an exemplary model of a binary operator gate 800 that includes a first input 802, a second input 804, and an output 806. In this example, the binary operator gate 800 compares two 32-bit inputs 802, 804 to produce a single-bit output 806.

Figure 8B:
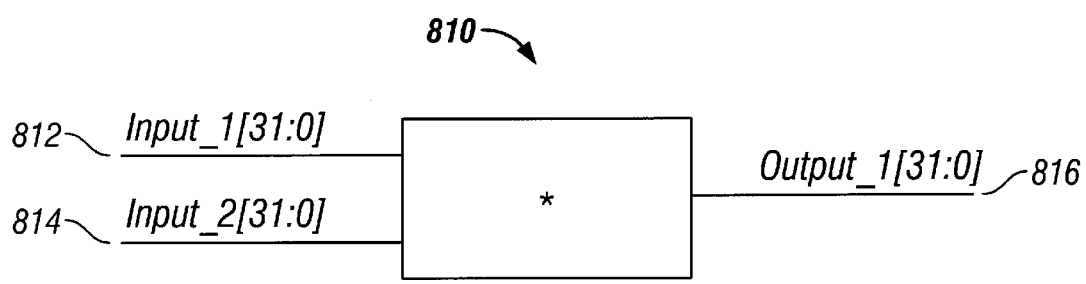
FIG. 8b is a block diagram of a model of a binary operator gate.

FIG. 8b illustrates an exemplary model of a binary operator gate 810 that includes a first input 812, a second input 814, and an output 816. In this example, the binary operator gate 810 multiplies two 32-bit inputs 812, 814 to produce a 32-bit output 816.

Figure 8C:
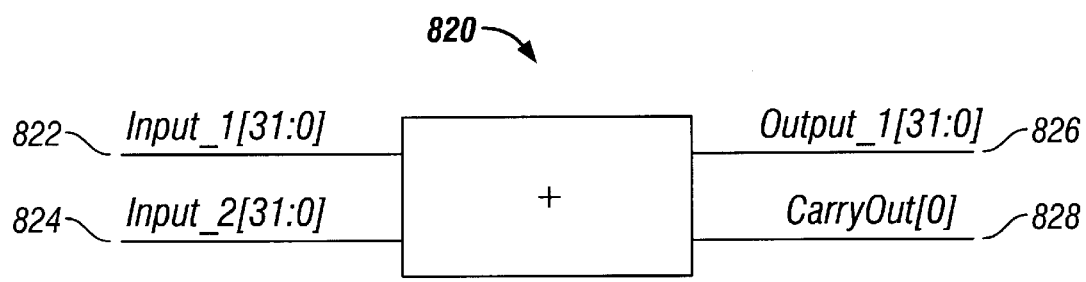
FIG. 8c is a block diagram of a model of a binary operator gate.

FIG. 8c illustrates an exemplary model of a binary operator gate 820 that includes a first input 822, a second input 824, an output 826, and a carry out bit 828. In this example, the binary operator gate 820 adds two 32-bit quantity inputs 822, 824 to produce a 32-bit output 826 and a carry out bit 828.

The described systems, methods, and techniques may be implemented in digital electronic circuitry, computer hardware, firmware, software, or in combinations of these elements. Apparatus embodying these techniques may include appropriate input and output devices, a computer processor, and a computer program product tangibly embodied in a machine-readable storage device for execution by a programmable processor.

A process embodying these techniques may be performed by a programmable processor executing a program of instructions to perform desired functions by operating on input data and generating appropriate output data. The techniques may be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; and in any case, the language may be a compiled or interpreted language. Suitable processors include, by way of example, both general and special purpose microprocessors. Generally, a processor will receive instructions and data from a read-only memory and/or a random access memory. Storage devices suitable for tangibly embodying computer program instructions and data include all forms of non-volatile memory, including by way of example semiconductor memory devices, such as Erasable Programmable Read-only Memory (EPROM), Electrically Erasable Programmable Read-Only Memory (EEPROM), and flash memory devices; magnetic disks such as internal hard disks and removable disks; magneto-optical disks; and Compact Disc Read-Only Memory (CD-ROM). Any of the foregoing may be supplemented by, or incorporated in, specially-designed ASICs (application-specific integrated circuits).

It will be understood that various modifications may be made. For example, advantageous results still could be achieved if steps of the disclosed techniques were performed in a different order and/or if components in the disclosed systems were combined in a different manner and/or replaced or supplemented by other components. Accordingly, other implementations are within the scope of the following claims.

What is claimed is:

1. A method of graphically representing a logic device, the method comprising:
    creating a single graphical model of a logic device, the single graphical model representing a collection of variants of the logic device;
    using an instance of the single graphical model in a schematic logic design; and
    automatically selecting a particular variant of the logic device from the collection of variants based on connections made to the instance of the single graphical model.

2. The method of claim 1 further comprising selecting the particular variant of the logic device based on an action that cycles through pin properties of the instance of the single graphical model.

3. The method of claim 1 further comprising automatically detecting one or more connection errors.

4. The method of claim 3 wherein automatically detecting one or more connection errors includes automatically detecting one or more bit width errors.

5. The method of claim 3 wherein automatically detecting one or more connection errors includes automatically detecting one or more unconnected pin errors.

6. The method of claim 3 further comprising automatically displaying a first indication of the one or more connection errors when the one or more connection errors are detected.

7. The method of claim 6 further comprising:
    correcting the one or more connection errors; and
    automatically displaying a second indication that differs from the first indication to indicate when the one or more connection errors are corrected.

8. The method of claim 1 further comprising:
    modifying a connection made to the instance of the single graphical model; and
    automatically detecting connection errors.

9. The method of claim 8 further comprising automatically displaying an indication when connection errors are detected.

10. The method of claim 1 further comprising generating a C++ model of the logic design.

11. The method of claim 1 further comprising generating a Verilog model of the logic design.

12. The method of claim 1 wherein:
    creating the single graphical model of the logic device includes creating the single graphical model of a state logic device, and
    automatically selecting the particular variant of the logic device includes automatically selecting the particular variant of the state logic device based on connections made to an instance of the single graphical model of the state logic device.

13. The method of claim 12 wherein:
    creating the single graphical model of the state logic device includes creating a single graphical model of a flip-flop, and
    automatically selecting the particular variant of the state logic device includes automatically selecting the particular variant of the flip-flop based on connections made to an instance of the single graphical model of the flip-flop.

14. The method of claim 12 wherein:
    creating the single graphical model of the state logic device includes creating a single graphical model of a latch, and
    automatically selecting the particular variant of the state logic device includes automatically selecting the particular variant of the latch based on connections made to an instance of the single graphical model of the latch.

15. The method of claim 1 wherein:
    creating the single graphical model of the logic device includes creating a single graphical model of a combinatorial logic device, and
    automatically selecting the particular variant of the logic device includes automatically selecting the particular variant of the combinatorial logic device based on connections made to an instance of the single graphical model of the combinatorial logic device.

16. The method of claim 15 wherein:
    creating the single graphical model of the combinatorial logic device includes creating a single graphical model of a multiplexer, and
    automatically selecting the particular variant of the combinatorial logic device includes automatically selecting the particular variant of the multiplexer based on connections made to an instance of the single graphical model of the multiplexer.

17. The method of claim 15 wherein:
    creating the single graphical model of the combinatorial logic device includes creating a single graphical model of an AND gate, and
    automatically selecting the particular variant of the combinatorial logic device includes automatically selecting the particular variant of the AND gate based on connections made to an instance of the single graphical model of the AND gate.

18. The method of claim 15 wherein:
    creating the single graphical model of the combinatorial logic device includes creating a single graphical model of a binary operator gate, and
    automatically selecting the particular variant of the combinatorial logic device includes automatically selecting the particular variant of the binary operator gate based on connections made to an instance of the single graphical model of the binary operator gate.

19. The method of claim 1 wherein:

creating the single graphical model of the logic device includes creating a single graphical model of a FIFO memory, and automatically selecting the particular variant of the logic device includes automatically selecting the particular variant of the FIFO memory based on connections made to an instance of the single graphical model of the FIFO memory.

20. A machine-accessible medium, which when accessed results in a machine performing operations comprising:

creating a single graphical model of a logic device, the single graphical model representing a collection of variants of the logic device;

using an instance of the single graphical model in a schematic logic design; and automatically selecting a particular variant of the logic device from the collection of variants based on connections made to the instance of the single graphical model.

21. The machine-accessible medium of claim 20, the operations further comprising selecting the particular variant of the logic device based on an action that cycles through pin properties of the instance of the single graphical model.

22. The machine-accessible medium of claim 20, the operations further comprising automatically detecting one or more connection errors.

23. The machine-accessible medium of claim 22 wherein automatically detecting one or more connection errors includes automatically detecting one or more bit width errors.

24. The machine-accessible medium of claim 22 wherein automatically detecting one or more connection errors includes automatically detecting one or more unconnected pin errors.

25. The machine-accessible medium of claim 22, the operations further comprising automatically displaying a first indication of the one or more connection errors when the one or more connection errors are detected.

26. The machine-accessible medium of claim 25, the operations further comprising:

correcting the one or more connection errors; and automatically displaying a second indication that differs from the first indication to indicate when the one or more connection errors are corrected.

27. The machine-accessible medium of claim 20, the operations further comprising:

modifying a connection made to the instance of the single graphical model; and automatically detecting connection errors.

28. The machine-accessible medium of claim 27, the operations further comprising automatically displaying an indication when connection errors are detected.

29. A system for graphically representing a logic device comprising:

a library module that is structured and arranged to include a single graphical model of a logic device, the single graphical model representing a collection of variants of the logic device; and a design capture module that is structured and arranged to use an instance of the single graphical model in a schematic logic design and to select automatically a particular variant of the logic device from the collection of variants based on connections made to the instance of the single graphical model.

30. The system of claim 29 wherein the design capture module is structured and arranged to select the particular variant of the logic device based on an action that cycles through pin properties of the instance of the single graphical model.

31. The system of claim 29 wherein the design capture module is structured and arranged to automatically detect one or more connection errors.

32. The system of claim 31 wherein the design capture module is structured and arranged to display automatically a first indication of the one or more connection errors when the one or more connection errors are detected.

33. The system of claim 32 wherein the design capture module is structured and arranged to display automatically a second indication that differs from the first indication to indicate when the connection errors are corrected.

34. The system of claim 29 wherein the design capture module is structured and arranged to modify a connection made to the instance of the single graphical model and to detect automatically for connection errors.

35. The system of claim 34 wherein the design capture module is structured and arranged to display automatically an indication when connection errors are detected.

* * * * *